United States Patent

[11] 3,614,552

[72] Inventor Hans-Joachim Teuschler
Berlin, Germany
[21] Appl. No. 14,840
[22] Filed Feb. 16, 1970
[23] Division of Ser. No. 819,419, Apr. 25, 1969
[45] Patented Oct. 19, 1971
[73] Assignee Kombinat VEB Elektonische Bavelemente
Teltow, Germany

[54] INSULATED GATE FIELD EFFECT TRANSISTORS
2 Claims, 1 Drawing Fig.

[52] U.S. Cl. .......... 317/235, 317/234
[51] Int. Cl. .......... H01l 11/14
[50] Field of Search .......... 317/235, 234

[56] References Cited
UNITED STATES PATENTS

| | | | |
|---|---|---|---|
| 1,745,175 | 1/1930 | Libinfeld | 317/231 |
| 1,900,018 | 3/1933 | Libinfeld | 317/231 |
| 2,648,805 | 8/1953 | Spenke et al. | 317/235 |
| 3,258,663 | 6/1966 | Weimer | 317/235 |

*Primary Examiner*—James D. Kallam
*Attorney*—Nolte and Nolte

ABSTRACT: An insulated gate field effect transistor the semiconductor channel layer of which is constituted of lustrous carbon doped with an oxide or carbide of an element of Group IV of the Periodic System. This layer may be prepared by pyrolyzing in the presence of an alkali-free substrate for the layer a compound the pyrolysis of which yields both the carbon and the oxide or carbide.

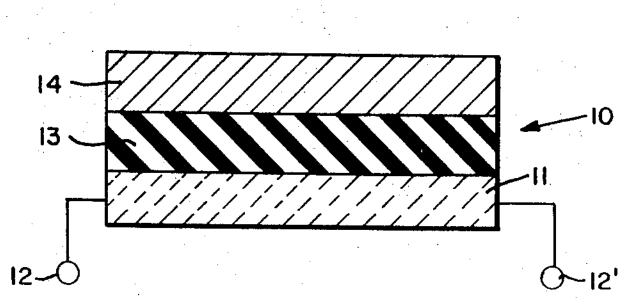
INVENTOR.
HANS-JOACHIM TEUSCHLER

INSULATED GATE FIELD EFFECT TRANSISTORS

This is a division of my application Ser. No. 819,419, filed Apr. 25, 1969.

This invention relates to an insulated gate field effect transistor the semiconductor channel layer of which having spaced terminals connected thereto, is separated from a control electrode metal layer by an insulating layer.

A field effect transistor (FET) of the insulated gate type is distinguished from blocking layer field effect transistors in that, due to its being parallel to the boundary layer, it forms no blocking layer. The effect is a charged condition which is similar to that of a condenser. In the fabrication of such a transistor two highly doped *n*-zones are diffused into a *p*-doped silicon lamella. On the silicon lamella a silica layer is deposited and on the insulating silica layer a metal layer is vapor deposited. The metal layer has a function of a control electrode and, consequently, is called a G-pole. On the terminals of the semiconducting channel two electrodes are fastened, a ground electrode (S-pole) and a receiving electrode (D-pole). If on the G- and S-poles a positive potential is produced in the semiconducting channel in the vicinity of the insulating layer a negative charge is formed. The magnitude of the current is controlled by the magnitude of the potential applied. Insulated gate FETs are, therefore, as in the case of vacuum tubes, controlled approximately wattless by an applied potential. A prerequisite is a high-entry resistance for the G-pole, as high as about $10^{14}$ ohms. Insulated gate FETs are active elements which can serve as full substitutes for vacuum tubes.

The known insulated gate FETs are based on high-purity individual crystals of elemental silicon and germanium or on compounds such as gallium arsenide, cadmium sulfide, indium sulfide and the like. Their manufacture involves costly and complex application of conventional semiconductor technology and is accompanied by a high reject rate.

The object of the invention is the manufacture of an insulated gate field effect transistor with a semiconductor channel from polycrystalline material, with reproducible results and according to relatively simple method and with the use of materials of a readily available degree of purity.

The object is achieved by providing an insulated gate field effect transistor according to the invention in which the semiconductor layer is constituted of lustrous carbon doped with an oxide or a carbide of an element of Group IV of the periodic system, preferably Si, Ti or Zr.

Pure, hexagonal lustrous carbon, as is conventional in the coatings of resistors formed by pyrolytic separation, in comparison with traditional semiconductor materials, the crystal systems of which are cubic, has an anisotropic behavior of electric conductivity. It is always polycrystalline. For use as the semiconductor channel layer material of an insulated gate FET it possesses, however, a specific conductivity which is too high and the desired standardization of the specific resistance is not possible. This requirement is attained according to the invention by the doping of the lustrous carbon with oxides or carbides.

The depositing of the semiconductor layer on an alkali-free substrate may be carried out pyrolytically. Thereby the conductivity of the semiconductor layer may be varied over a number of orders of magnitude by variation of the dope content and the pyrolysis temperature. The specific resistance of the semiconductor layer may be provided in accordance with the intended working resistance by varying the thickness of the layer.

The pyrolytic deposition of the semiconductor layer on the substrate may, for example, be carried out by the use of lower alkyl half esters of silicic acid in which the alkyl is of 1 to 3 carbon atoms of dimethyldiethoxy silicon. Dimethyldiethoxy silicon, for example, is quantitatively split at a pyrolysis temperature of about 900° to 960° C, according to the following equation:

$(CH_3)_2Si(OC_2H_5)_2 \rightarrow 6C + SiO_2 + 8\ H_2$ Likewise suitable is any compound of the formula $M(OR^1)_2(R^2)_2$ in which M is silicon, titanium or zirconium and $R^1$ and $R^2$ are each an alkyl preferably of one to three carbon atoms. It should be understood, however, that these particular alkyl groups do not constitute an absolute limitation with respect either to the half esters of silicic acid or the $M(OR^1)_2(R^2)_2$ compounds. The criterion for selection of the alkyl groups is that the resultant compounds have a vapor pressure sufficiently high not to make vaporization thereof unduly inconvenient or costly. Therefore, strictly speaking, it is by no means impossible to employ in the present invention compounds including alkyl groups of more than three carbon atoms; this is particularly so with respect to iso-alkyls since compounds containing iso-alkyls are of higher vapor pressure than like compounds containing normal alkyls of the same carbon atoms numbers. By the use of these compound there can also be produced according to the pyrolysis conditions complete or partial carbide doping. This has the advantage in that the temperature coefficient of the semiconductor layer can be compensated.

On the semiconductor layer the insulating layer is deposited in the known way by vapor deposition. It can, however, also be effected in a simple manner directly after the pyrolytic deposition of the semiconductor layer and in the same reaction zone by an only partial pyrolysis of the same compound, in which the pyrolysis temperature is held at a level below that at which carbon deposition occurs. The process proceeds, in the case of dimethyldiethoxy silicon, for example, according to the following equation:

$$(CH_3)_2Si(OC_2H_5)_2 \rightarrow SiO_2 + 2.\ CH_3 + 2.C_2H_5$$

The hydrocarbon radicals can easily be conducted out of the reaction zone; they indeed tend to polymerize but the polymerizates remain in the reaction zone in gas form. The pyrolysis temperature for this reaction is the range of about 3002 to about 5002 C.

In all instances, of course, temperature necessary to achieve the desire pyrolysis will vary inversely with the magnitude of the period in which the compound is maintained at the temperature. Moreover, the pyrolysis temperature will vary from compound to compound. In each case, however, the appropriate temperature clearly is routinely determinable.

The provision of the metal layer as well as the provision of the contacts for the G-, S- and D-poles is carried out by the known techniques.

An exemplary FET according to the invention is schematically illustrated in the drawing in section. It will be understood that the thicknesses of the layers are greatly exaggerated for the purpose of clarity.

The FET 10 comprises a semiconductor channel layer 11 with spaced terminals 12 and 12' electrically connected thereto, the layer 11 being composed of polycrystalline lustrous carbon, overlying the channel layer 11 an insulating layer 13 composed of silica, and overlying the layer 13 a control electrode metal layer 14.

The method of the invention is not encumbered by costly and difficult to master crystal purification and growing methods. The pyrolytic technique permits the varying of the resistance of the semiconductor layer to accommodate wide ranges of operating resistance by full utilization of the varying of the specific resistance of the semiconductor layer by varying its thickness.

What I claim is:

1. An insulated gate field effect transistor, comprising a semiconductor channel layer with spaced terminals connected thereto, a control electrode metal layer disposed over the channel layer between said terminals and an insulating layer separating the semiconductor channel layer and the control electrode metal layer, said semiconductor layer being composed of polycrystalline lustrous carbon doped with an oxide or carbide of an element of Group IV of the Periodic Table of elements.

2. A transistor according to claim 1, in which the substrate for the semiconductor layer is alkali-free.